(12) United States Patent
Kiehlbauch et al.

(10) Patent No.: US 8,512,582 B2
(45) Date of Patent: Aug. 20, 2013

(54) METHODS OF PATTERNING A SUBSTRATE

(75) Inventors: Mark Kiehlbauch, Boise, ID (US); Brett W. Busch, Boise, ID (US); Tuman Earl Allen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 1058 days.

(21) Appl. No.: 12/210,797

(22) Filed: Sep. 15, 2008

(65) Prior Publication Data

US 2010/0065531 A1    Mar. 18, 2010

(51) Int. Cl.
*B44C 1/22* (2006.01)

(52) U.S. Cl.
USPC ............. 216/41; 216/37; 216/49; 216/67; 438/700; 438/701; 438/745

(58) Field of Classification Search
USPC ............. 216/37, 41, 67, 49; 438/700, 701, 438/745
See application file for complete search history.

(56) References Cited

U.S. PATENT DOCUMENTS

| | | | | |
|---|---|---|---|---|
| 6,080,325 | A * | 6/2000 | Cathey et al. | 216/11 |
| 7,186,650 | B1 | 3/2007 | Dakshina-Murthy | |
| 7,319,067 | B2 | 1/2008 | Chou et al. | |
| 7,378,341 | B2 | 5/2008 | Chou et al. | |
| 7,838,432 | B2 * | 11/2010 | Wang et al. | 438/714 |
| 2004/0077160 | A1 | 4/2004 | Singh | |
| 2005/0059251 | A1 | 3/2005 | Kao et al. | |
| 2005/0064714 | A1 | 3/2005 | Mui et al. | |
| 2008/0160766 | A1 * | 7/2008 | Kim et al. | 438/701 |

FOREIGN PATENT DOCUMENTS

| | | |
|---|---|---|
| KR | 20040004983 | 1/2004 |
| KR | 200743170 | 11/2007 |
| TW | 430878 | 4/2001 |
| TW | 578234 | 3/2004 |
| TW | 249773 | 2/2006 |

OTHER PUBLICATIONS

Li et al. International Conf. on Solid-State Sensors and Actuators, (1997) pp. 699-702.*
Richter et al. Surface Science & Technol. vol. 142-144, (20010) pp. 797-802.*
Parekh et al., "Close-Packed Noncircular Nanodevice Pattern Generation by Self-Limiting Ion-Mill Process", Nano Letters, 2007, vol. 7, No. 10, pp. 3246-3248.

* cited by examiner

*Primary Examiner* — Lan Vinh
*Assistant Examiner* — Maki Angadi
(74) *Attorney, Agent, or Firm* — Wells St. John, P.S.

(57) ABSTRACT

A method of patterning a substrate in accordance with an embodiment of the invention includes forming a plurality of openings within at least one of photoresist and amorphous carbon. The openings are of common outermost cross sectional shape relative one another. Individual of the openings have at least one lateral open dimension having a degree of variability among the plurality. The photoresist with the plurality of openings is exposed to/treated with a plasma effective to both increase the lateral open size of the openings and at least reduce the degree of variability of said at least one open dimension among the openings. Other aspects and implementations are contemplated.

39 Claims, 16 Drawing Sheets

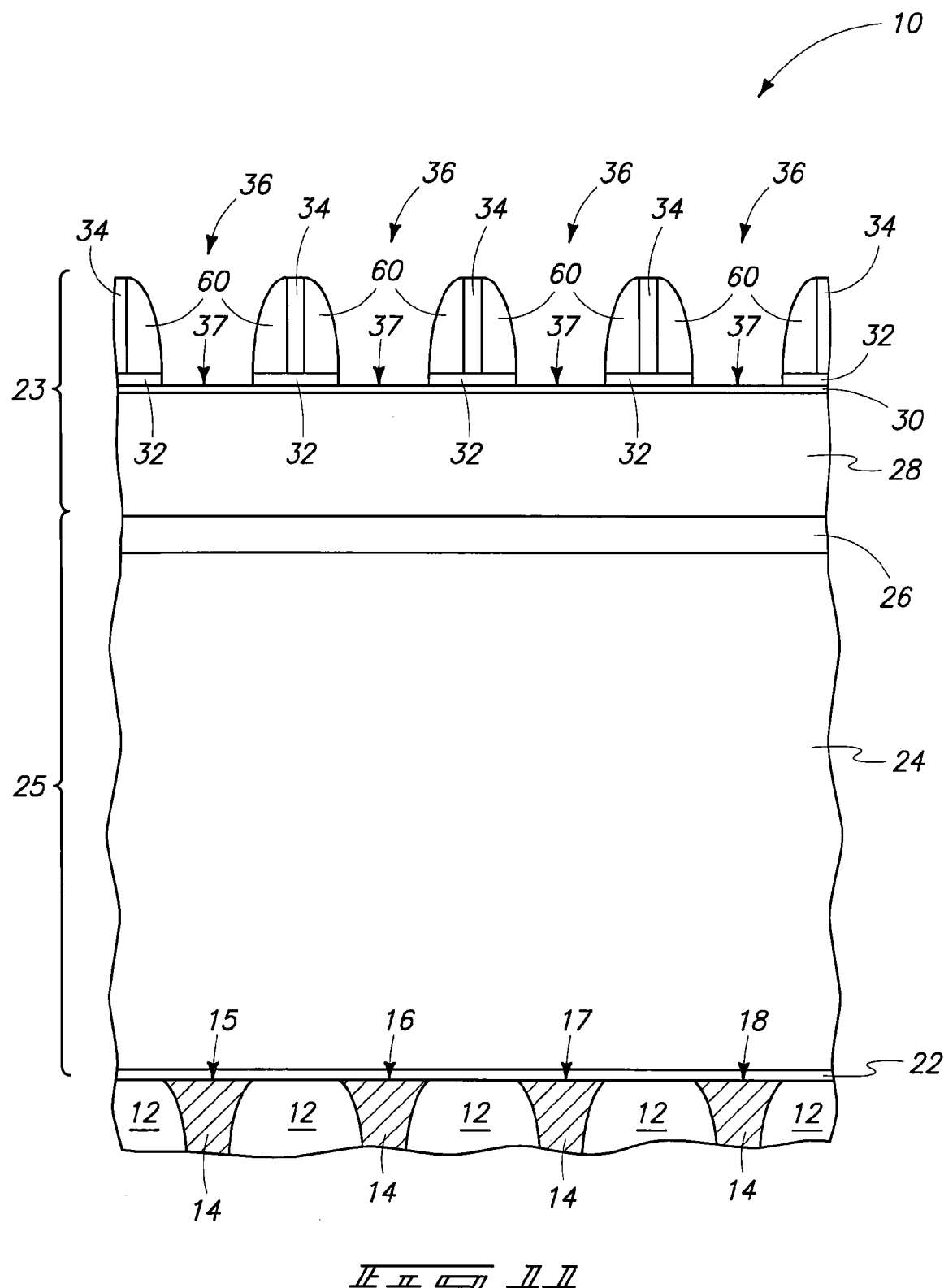
F I G 11

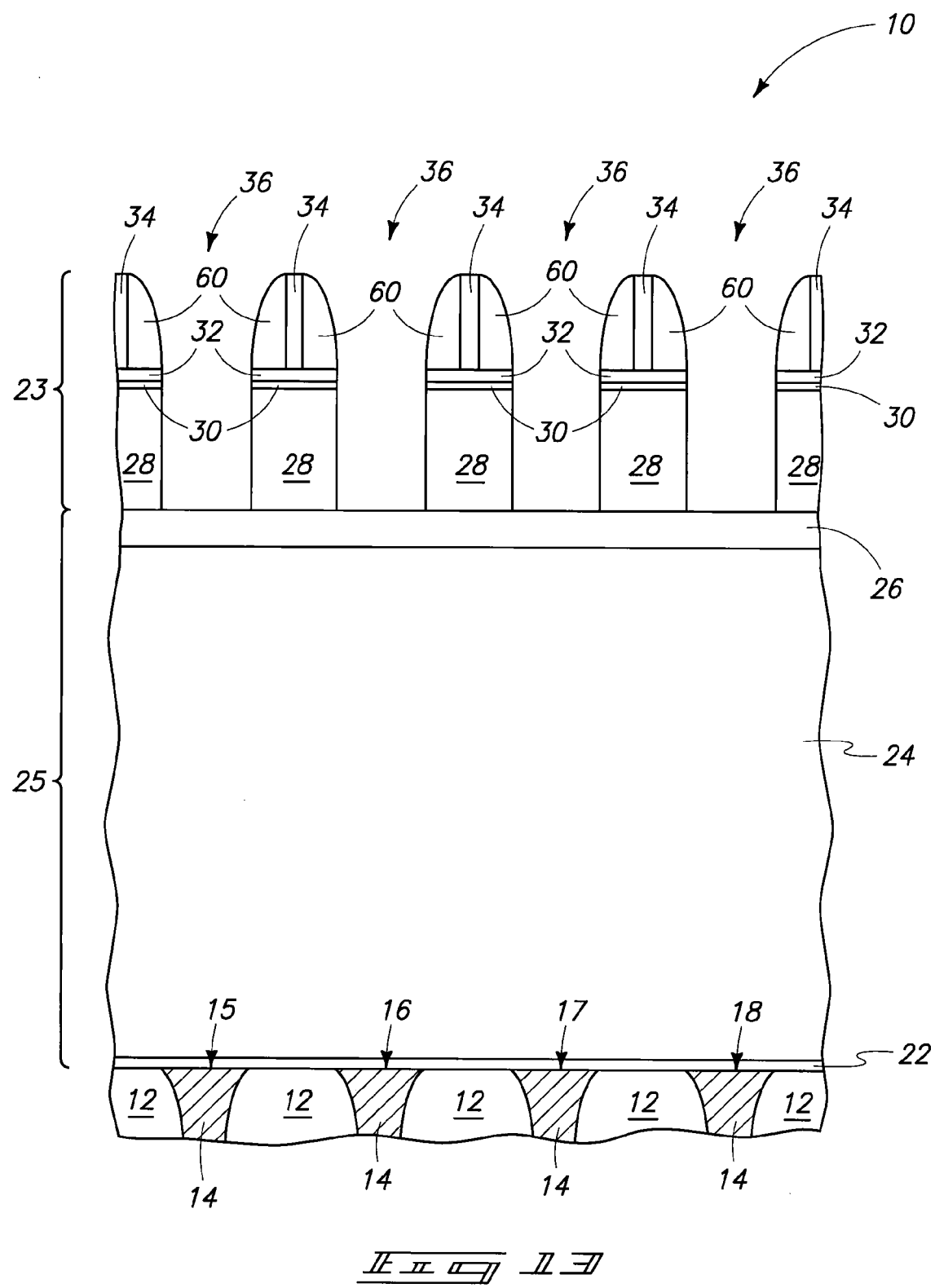
_FIG 13_

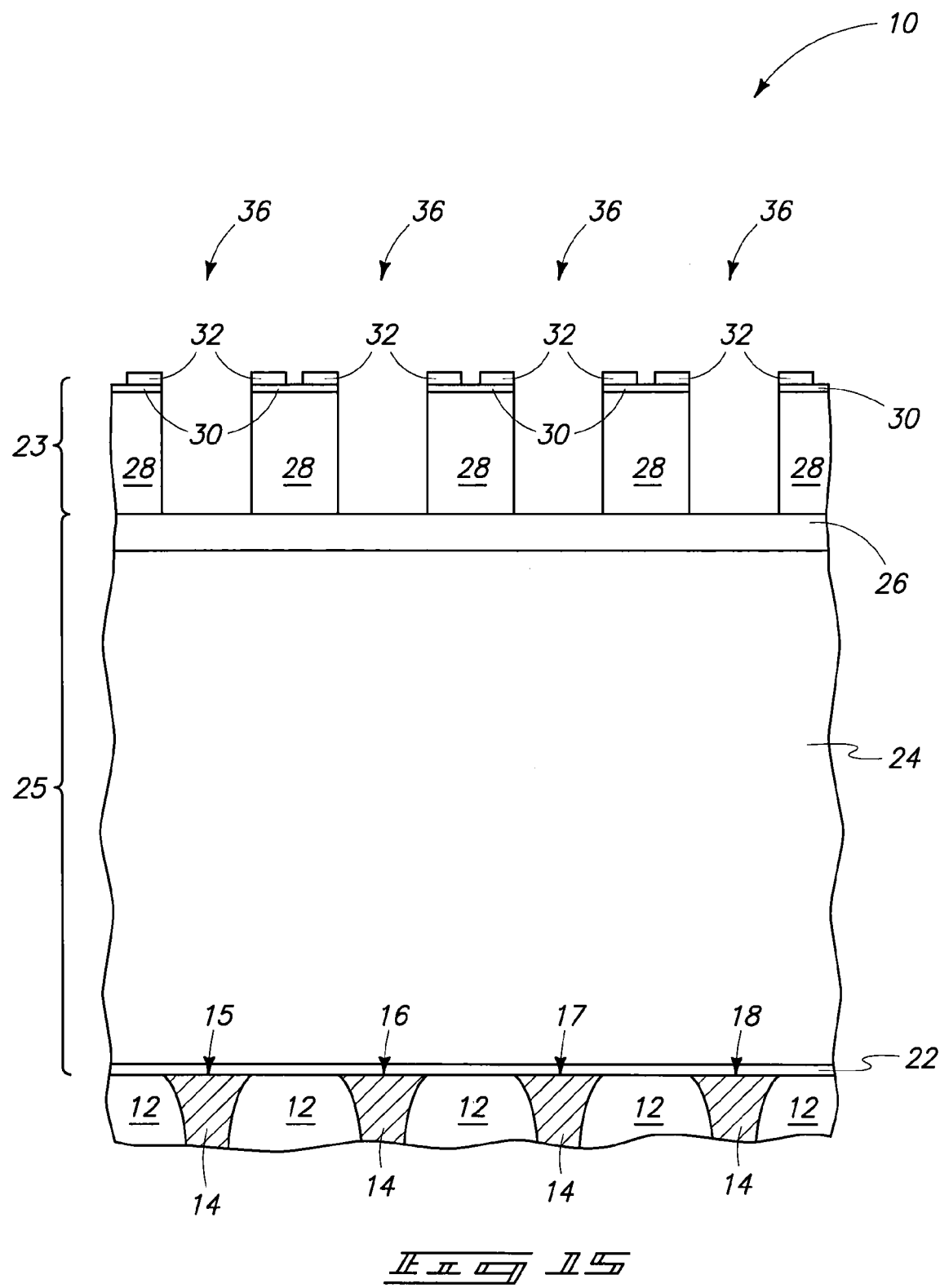
F I G 15

METHODS OF PATTERNING A SUBSTRATE

TECHNICAL FIELD

Embodiments disclosed herein pertain to methods of patterning a substrate.

BACKGROUND

Capacitors are one type of component commonly used in the fabrication of integrated circuits, for example in DRAM circuitry. A capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. A plurality, or array, of capacitor electrode openings for individual capacitors may be fabricated in such insulative capacitor electrode-forming material, with an example material being silicon nitride and/or silicon dioxide doped with one or both of phosphorus and boron. The capacitor electrode openings are typically formed by etching through openings formed in a mask that is received over the insulative electrode-forming material. The mask is formed, at least in part, using photoresist into which the desired mask openings are formed. Unfortunately, variability in the size of the respective openings across the array can occur and becomes more problematic the smaller the openings and, correspondingly, the closer the openings are spaced.

For example, consider a circular or oval contact opening having a central open diameter of about 55 nanometers. Variability in this dimension of up to 10 to 15 nanometers across the array may be found. This is significant in terms of percentage of the targeted and desired 55 nanometer contact opening size as well as spacing between adjacent of such openings. This can adversely impact techniques used to fabricate the capacitors, and as well induce device differences due to variation in the final capacitor size. Accordingly, it would be desirable to improve upon existing techniques in forming a plurality of openings in a mask for formation of capacitors or other devices, and whether such openings are used for etching, ion implanting, or other processing through the openings relative to substrate material received beneath the mask.

BRIEF DESCRIPTION OF THE DRAWINGS

FIG. 11 is a sectional view taken through line 11-11 in FIG. 10.

FIG. 13 is a view of the FIG. 12 substrate at a processing subsequent to that shown by FIG. 12.

FIG. 15 is a view of the FIG. 14 substrate at a processing subsequent to that shown by FIG. 14.

DETAILED DESCRIPTION OF EXAMPLE EMBODIMENTS

Figure 1:
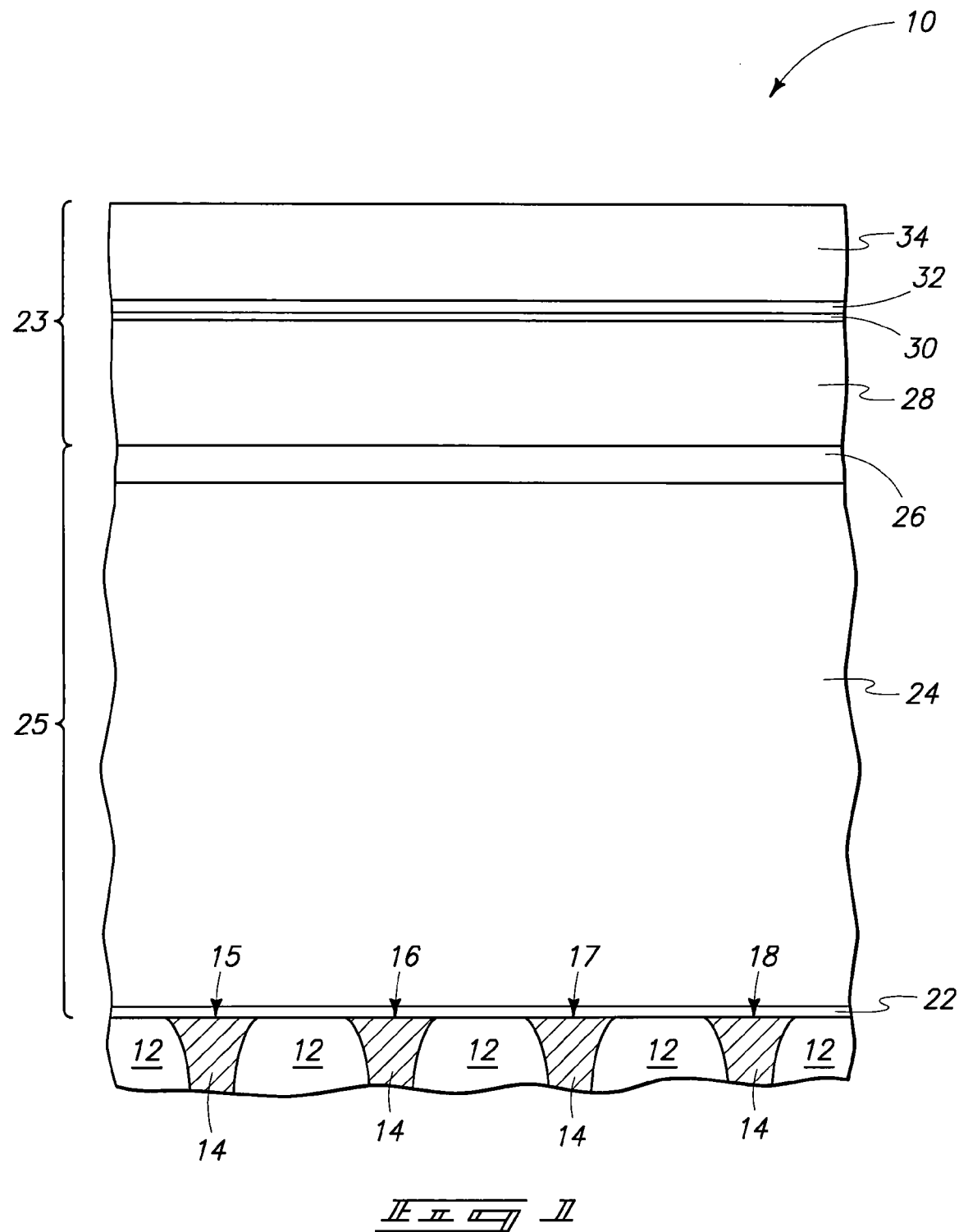
FIG. 1 is a diagrammatic sectional view of a semiconductor substrate in process in accordance with an embodiment of the invention.

Example methods of patterning a substrate are described with reference to FIGS. 1-16. Referring initially to FIG. 1, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, and by way of example only, FIG. 1 might comprise a bulk semiconductor material (not shown), for example bulk monocrystalline silicon, and/or comprise semiconductor-on-insulator layers.

The discussion proceeds with respect to an embodiment wherein an array of tightly-packed capacitors is being fabricated. Embodiments of the invention, however, encompass fabrication of other devices and circuitry. FIG. 1 depicts an insulative material 12 having electrically conductive storage node pillars 14 formed there-through. Materials 12 and 14 may be fabricated over some suitable underlying material, for example bulk monocrystalline silicon and/or underlying circuitry. Example insulative materials 12 include doped and undoped silicon dioxides, for example silicon dioxide deposited by the decomposition of tetraethylorthosilicate (TEOS) and/or borophosphosilicate glass (BPSG) and/or silicon nitride. Alternately by way of example only, material 12 might comprise anisotropically etched insulative sidewall spacers, for example formed about transistor gate lines (not shown). An example material 14 is conductively doped polysilicon. Conductive material 14 can be considered as comprising or defining a plurality of capacitor storage node locations 15, 16, 17 and 18 on substrate 10. Storage node locations 15, 16, 17 and 18 are examples only, and regardless, may be conductive at this point in the process, or made conductive subsequently.

A layer 22 may be been formed over material 12 and capacitor storage node locations 15, 16, 17 and 18. Examples for layer 22 comprise silicon nitride and/or undoped silicon dioxide deposited to a thickness range of from about 100 Angstroms to about 2,000 Angstroms. Layer 22 might be included to provide an etch stop, or other function.

Insulative material 24 may be received over layer 22. Such might be homogenous or comprise multiple different compositions and/or layers. An example material is doped silicon dioxide comprising at least one of phosphorous and boron, for example BPSG, borosilicate glass (BSG), and/or phosphosilicate glass (PSG). An example thickness range for material 24 is from about 5,000 Angstroms to about 10 microns, with about 2 microns being a specific example.

A masking material 26 (in one embodiment an insulator layer other than doped silicon dioxide) may be received over insulative material 24. As examples, such may comprise, consist essentially of, or consist of silicon nitride. An example thickness range is from about 200 Angstroms to about 5,000 Angstroms.

A hardmask material 28 may be received over layer 26. In one embodiment, such comprises amorphous carbon. An example thickness range is from about 500 Angstroms to about 1 micron.

An inorganic antireflective coating 30 may be received over hardmask material 28. Example materials include Si—O—N-comprising materials. An example thickness range is from about 100 Angstroms to about 500 Angstroms. An organic antireflective coating 32 may be received over inorganic antireflective coating 30. Example materials include any commercially available BARC. An example thickness range for organic antireflective coating 32 is from about 100 Angstroms to about 600 Angstroms.

Photoresist material 34 may be received over organic antireflective coating 32. Any existing or yet-to-be developed positive or negative photoresist may be used. In the context of this document, a "photoresist" is some material capable of being photo-patterned with incident radiation having a wavelength range of from 22 nanometers to 365 nanometers. By way of examples only, specific examples include 22 nanometer photoresist, 193 nanometer photoresist, 248 nanometer photoresist, and 365 nanometer photoresist. An example thickness range for photoresist 34 is from about 500 Angstroms to about 3,000 Angstroms. An alternate material 34 comprises amorphous carbon, and independent of example materials 32, 30, and 28 being received therebeneath.

In one example embodiment, materials 28, 30, 32 and 34 collectively comprise a mask 23 received over a material to be etched 25 which collectively comprises materials 22, 24 and 26. Where an embodiment of the invention encompasses etching a material received beneath a mask, the material being etched may be homogenous or non-homogenous. Further, the mask may be homogenous or non-homogenous, and regardless will comprise at least one of a) photoresist as defined above, and b) amorphous carbon. Photoresist or amorphous carbon may or may not be the outermost portion of the mask. Accordingly, the mask does not require hardmasking material, and does not require one or more antireflective coating layers. Further, where an antireflective coating is used, materials 30 and 32 in combination can also be considered as an antireflective coating.

Figure 2:
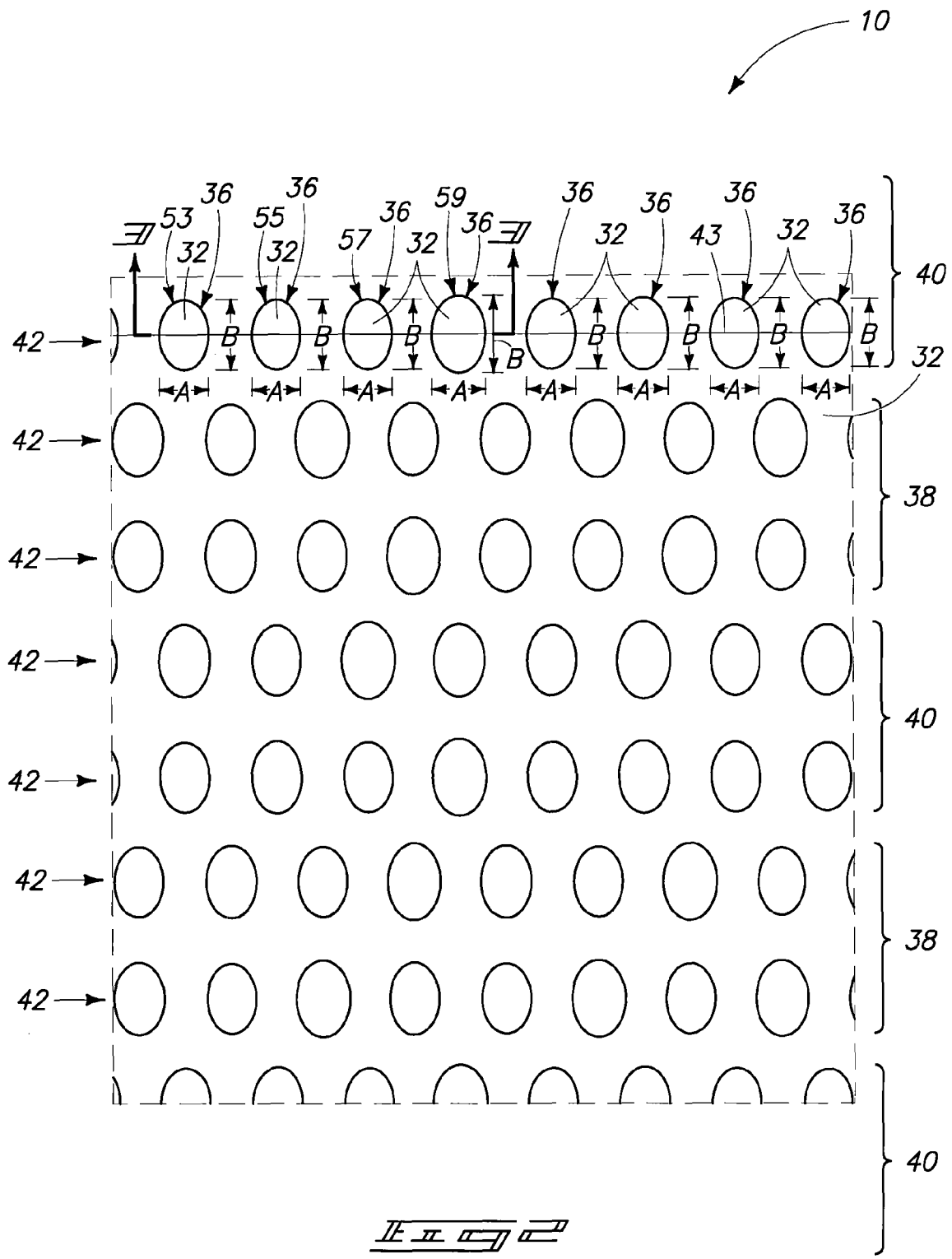
FIG. 2 is a top view of the FIG. 1 substrate at a processing subsequent to that shown by FIG. 1.
Figure 3:
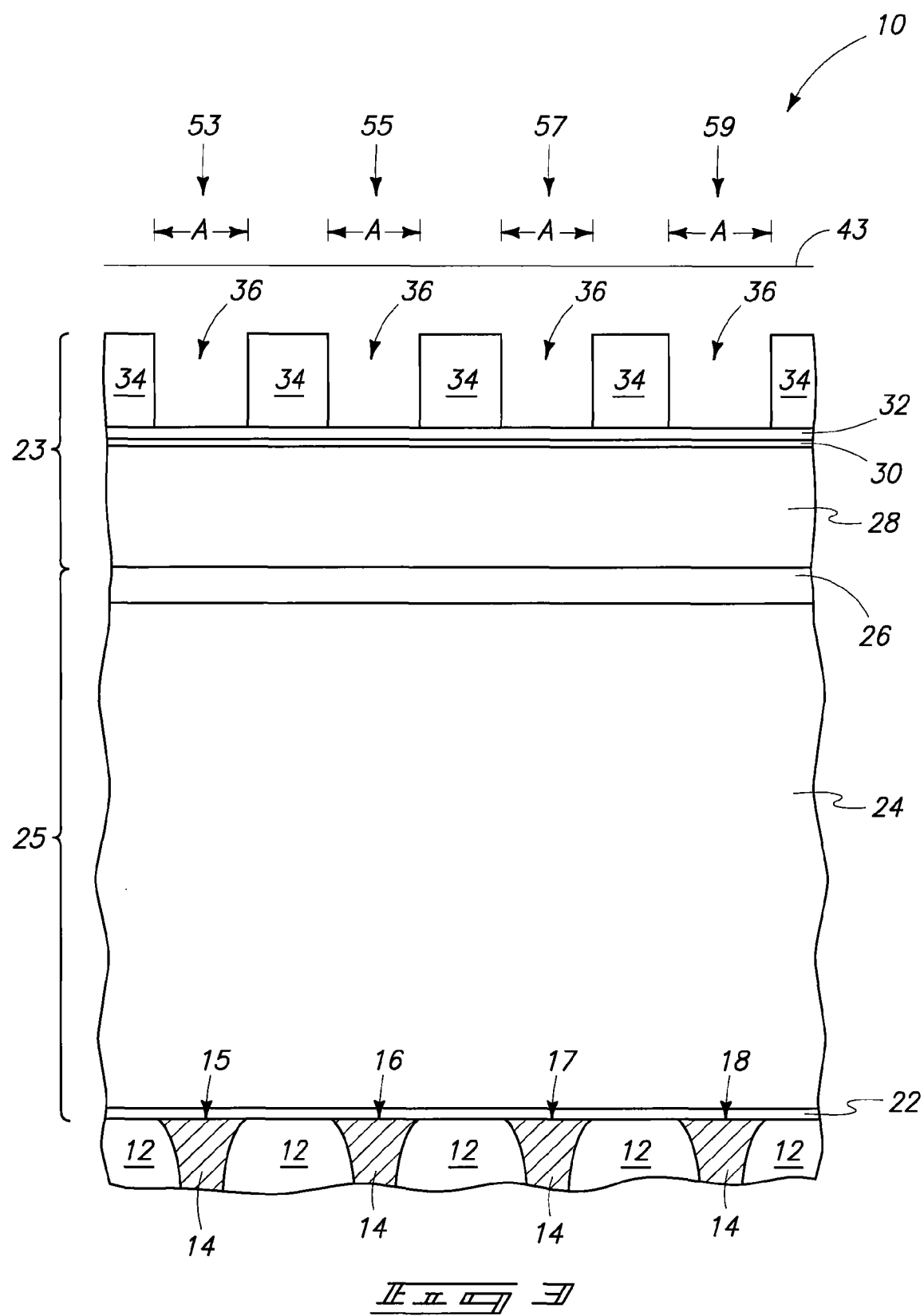
FIG. 3 is a sectional view taken through line 3-3 in FIG. 2.

Referring to FIGS. 2 and 3, a plurality of openings 36 has been formed through photoresist 34 to organic antireflective coating 32. Such openings are of common outermost cross sectional shape relative one another. In the context of this document, a common outermost cross sectional shape does not require the exact same shape among the openings and encompasses slightly different shapes that may result from artifacts created in transferring or creating the openings from a reticle/mask having a plurality of common cross sectional shaped openings. Further, the plurality of openings may be of different overall size relative one another and/or orientation relative one another. Further, not all of the openings necessarily will be of common outermost cross sectional shape relative one another, but nevertheless some plurality of adjacent openings will have perceptible common outermost cross sectional shape.

By way of example only, FIG. 2 in top view depicts individual openings 36 having a common outermost cross sectional shape of oval, and more particularly with the oval being that of an ellipse. In one embodiment, the outermost cross sectional shape comprises curved sides, and in another embodiment the outermost cross sectional shape consists essentially of curved sides, for example as being oval in the FIG. 2 embodiment. Alternate shapes consisting essentially of curved sides are also contemplated (i.e., circles), as well as shapes comprising a combination of straight and curved sides (i.e., race track shapes). Straight-sided polygon shapes may also be used, for example squares, rectangles, triangles, etc.

FIG. 2 depicts an example embodiment comprising alternating first and second pairs 38, 40, respectively, of rows 42 of openings 36 within photoresist 34. Alternating first and second pairs 38, 40, respectively, of rows 42 are characterized relative one another by having their respective openings 36 offset relative to the openings 36 in immediately adjacent of the other of the first pair 38 or second pair 40 of rows 42. In other words, row pairs 38 and row pairs 40 are offset relative to one another as is apparent in FIG. 2. Regardless, in one embodiment, a method of patterning a substrate comprises forming a plurality of openings along a line within at least one of photoresist and amorphous carbon, for example a plurality of openings 36 formed along a line 43 within material 34 within an example given row 42.

In one embodiment, individual of openings 36 have at least one lateral open dimension "A" having a degree of variability among the plurality. The corresponding dimension A of each opening 36 may vary between two different openings 36. Accordingly in such embodiment, open dimensions A in the direction along line 43 will include at least two different dimensions A so that there is some degree of variability of such length among openings 36 in the direction along line 43. FIGS. 2 and 3 depict one such example variability. For example, the openings 36 of FIG. 2 that are also shown by the FIG. 3 cross section have additionally been designated with numerals 53, 55, 57, and 59. In such example, opening dimension A of opening 59 is larger than opening dimension A of each of openings 53, 55, and 57. Further in such example, and by way of example only, opening dimension A is the same among openings 53, 55, and 57. Alternately, one, two or three of opening dimensions A among openings 53, 55, and 57 could be different.

In one embodiment, individual openings 36 can also be considered as having an open dimension B orthogonal to the direction along line 43. In such embodiment, open dimension B may or may not have a degree of variability among the openings in the direction along the line 43. FIG. 2 depicts one such example variability wherein at least two different open dimensions B exist along line 43.

Openings 36 in material 34 may be formed by any existing or yet-to-be-developed manners. For example where material 34 is photoresist, such can be inherently patterned using photolithography with a mask/reticle and a selected incident radiation wavelength to which the photoresist is photoactive. Alternate techniques to form openings 36 might be used even if material 34 is photoresist. If material 34 comprises amorphous carbon, a patterned photoresist layer (not shown) might be received over material 34 and used as an etch mask to form openings 36 in material 34. Alternate techniques could be used.

Figure 4:
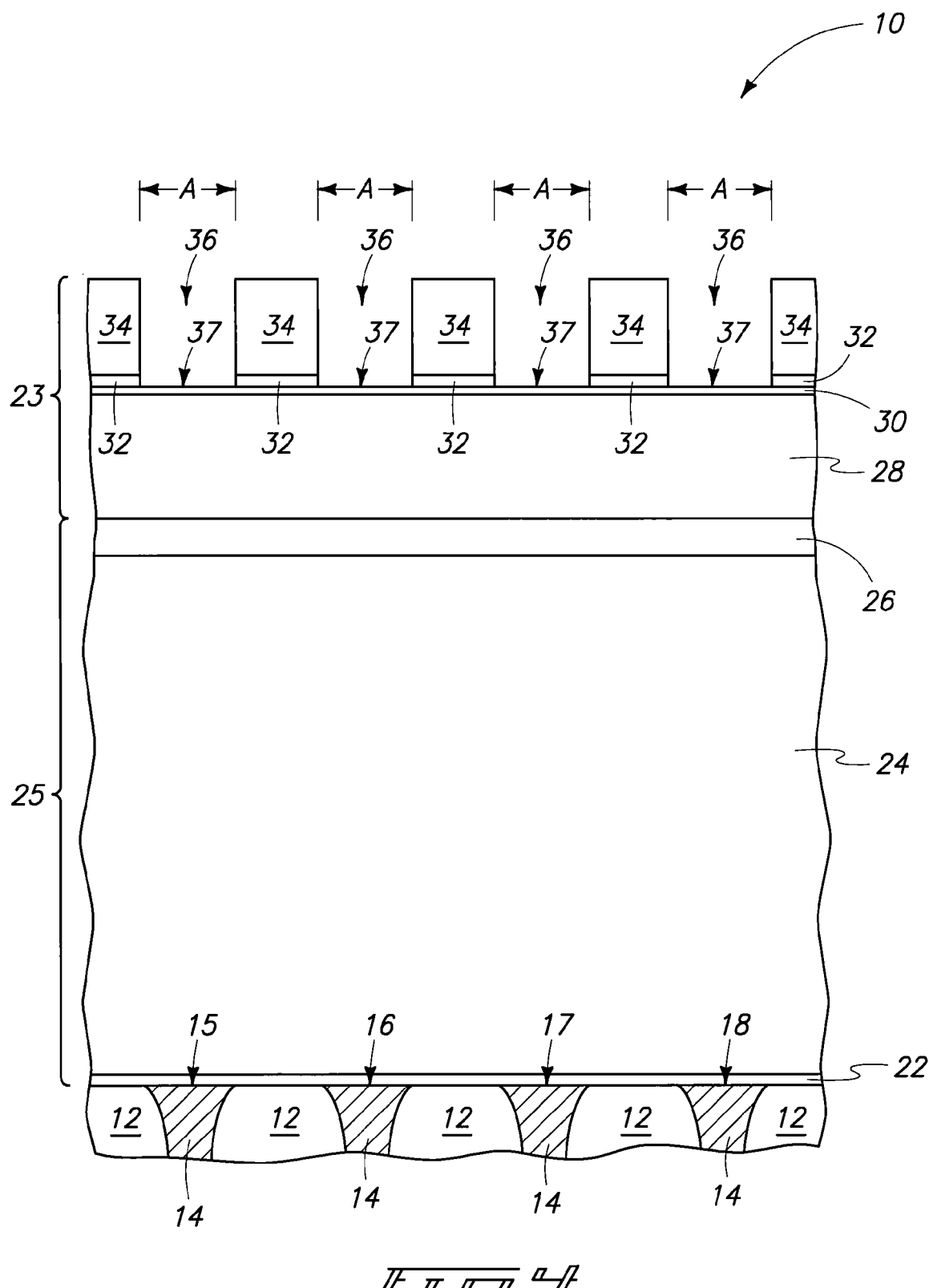
FIG. 4 is a view of the FIG. 3 substrate at a processing subsequent to that shown by FIG. 3.

Referring to FIG. 4, organic antireflective coating 32 has been etched to extend the plurality of openings 36 through organic antireflective coating 32 to inorganic antireflective coating 30, with openings 36 for purposes of the continuing discussion having bases 37. By way of example only, a suitable anisotropic etching chemistry includes a combination of $SO_2$ and $O_2$.

In one embodiment, the at least one of photoresist and amorphous carbon having the plurality of openings is treated with a plasma effective to increase lateral open size of the openings, for example to increase one or both of dimensions A and B in the FIGS. 2 and 3 example. In one embodiment, treating of the photoresist with the plasma is effective to both increase the lateral open dimensions among the openings along the line and at least reduce the degree of variability of such open dimensions among the openings along the line. Further in one embodiment, the treating with the plasma is effective to increase the open dimensions of the individual openings orthogonal to the line.

Figure 5:
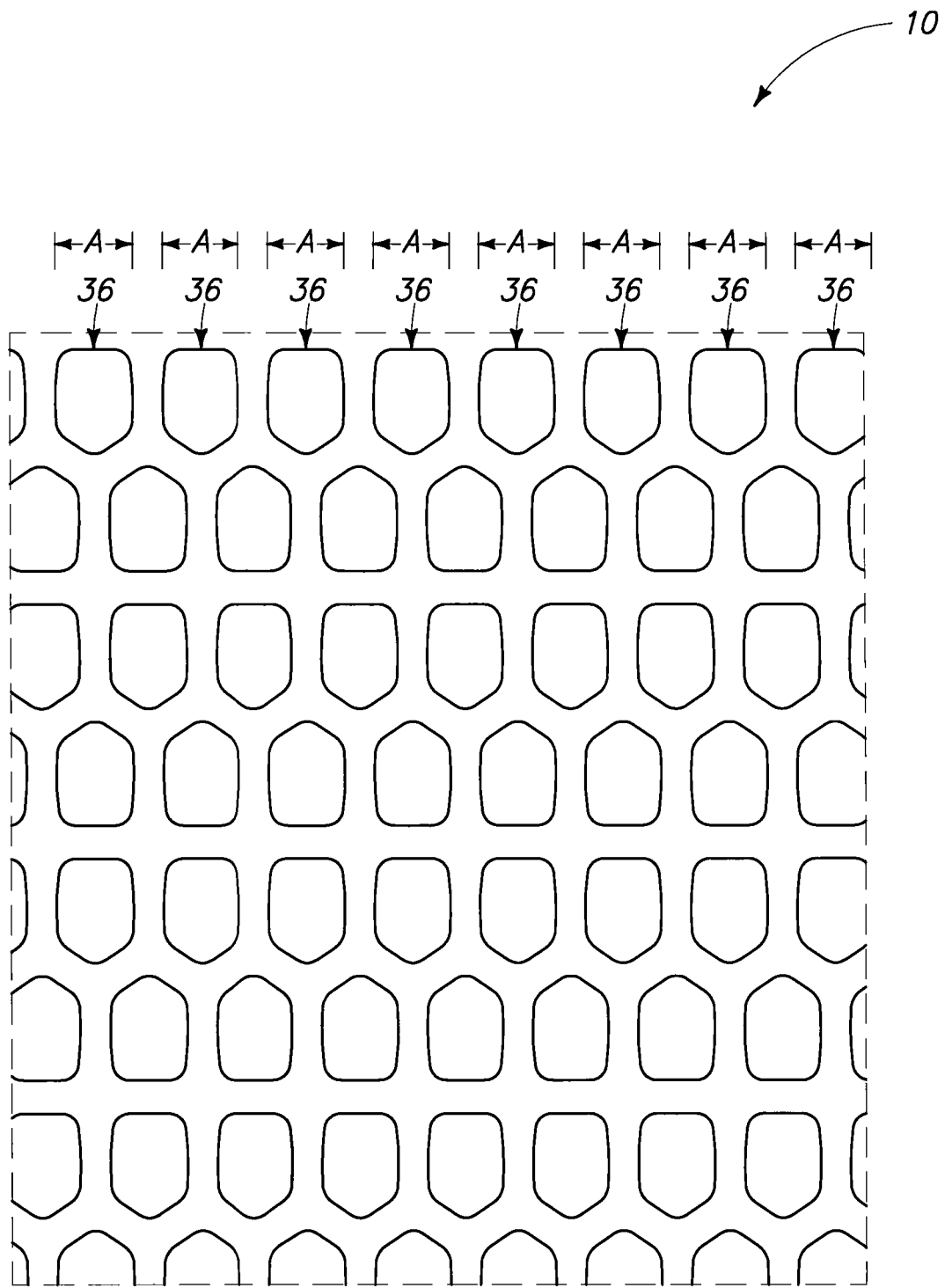
FIG. 5 is a diagrammatic top plan view of the FIG. 2 substrate at a processing subsequent to that shown by FIG. 2.
Figure 6:
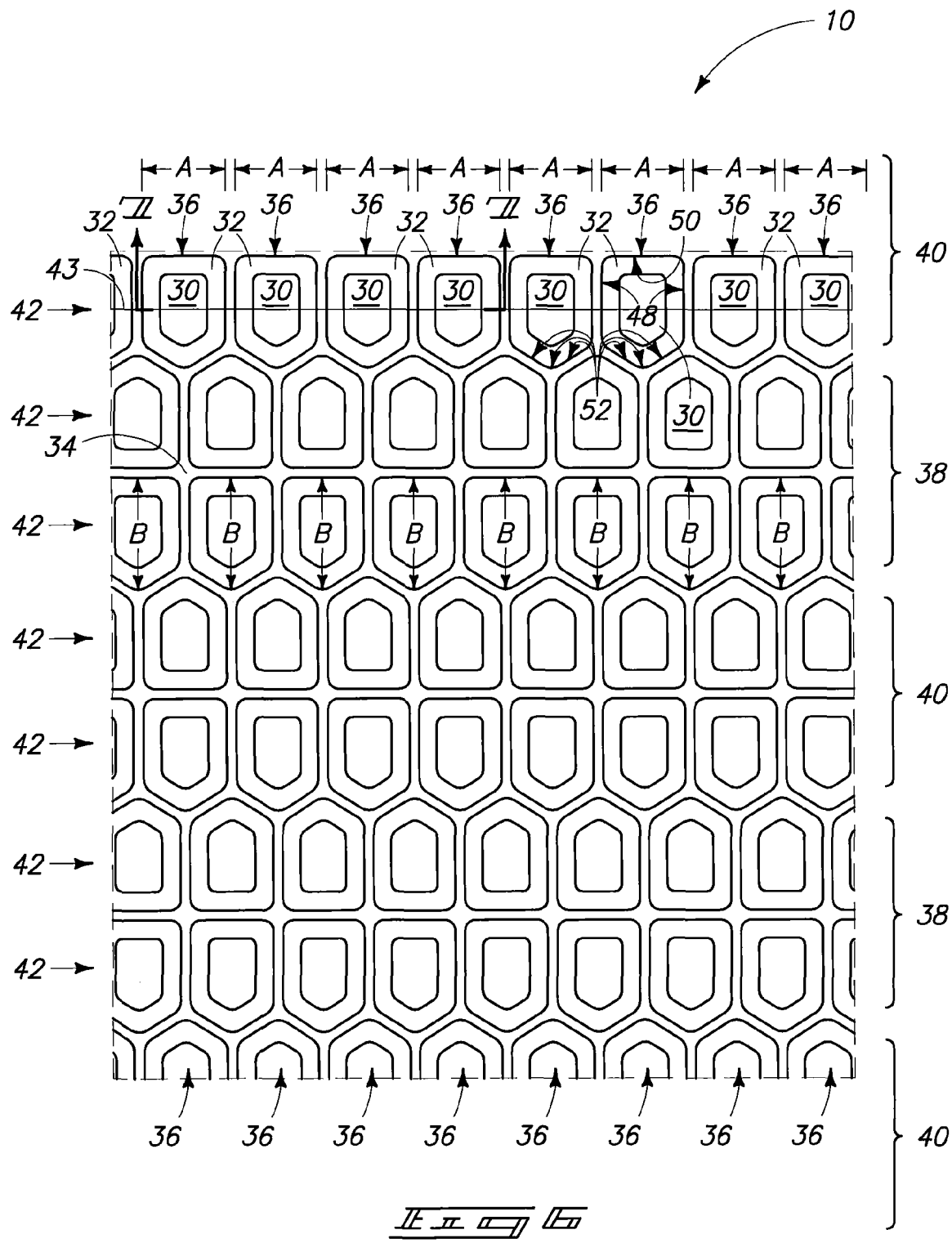
FIG. 6 is a top plan view of the FIG. 4 substrate at a processing subsequent to that shown by FIGS. 4 and 5.
Figure 7:
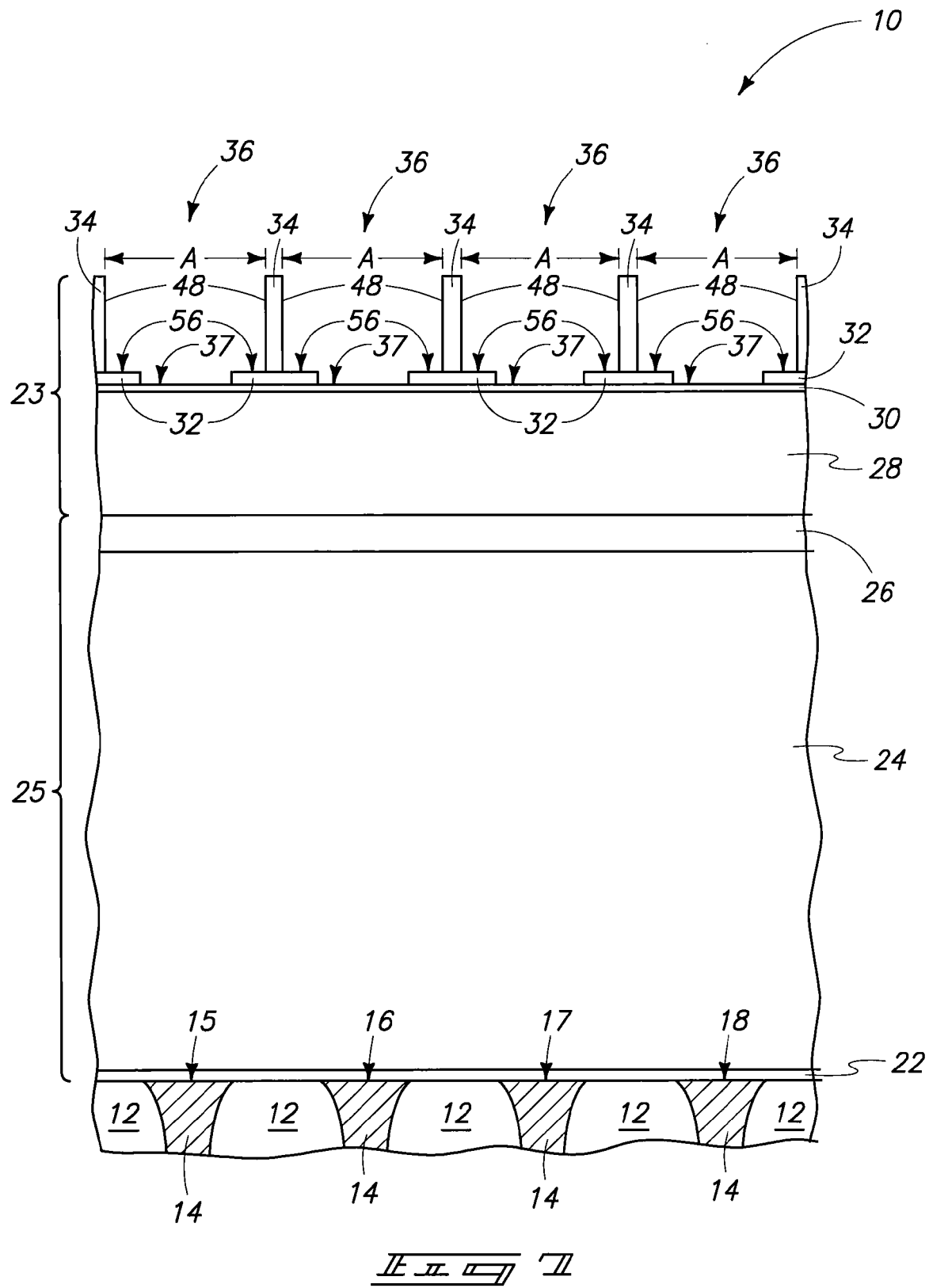
FIG. 7 is a sectional view taken through line 7-7 in FIG. 6.

For example with reference to FIGS. 5, 6 and 7, FIG. 5 diagrammatically depicts the treatment of the FIG. 4 substrate with a plasma effective to both increase open dimensions A in the direction along the line 43 and at least reduce the degree of variability of open dimensions A in the direction along the line 43 among openings 36. FIGS. 6 and 7 depict continued treating with a plasma that further increases open dimension A in the direction along line 43 of the individual openings, and increases open dimensions B orthogonal to the direction along line 43 of individual openings 36. Regardless, the treating with plasma may or may not change the common outermost cross sectional shape of the openings. FIGS. 5-7 depict embodiments wherein the treating has changed the common outermost cross sectional shape. Where such shape is changed, in one embodiment, the common outermost cross sectional shape before the treating with plasma may be void of straight sides, and the common outermost cross sectional shape after the treating may comprise at least one straight side. In the depicted FIGS. 5 and 6 examples, the common outermost cross sectional shape initially was oval (FIG. 2), and has been transformed to being pentagonal. For example in FIGS. 6 and 7, the depicted common pentagonal shape comprises opposing parallel sidewalls 48 and a base 50 which extends between opposing parallel sidewalls 48. A two-sided pointed end 52 is received opposite base 50. Further in the depicted embodiment, bases 50 of each of openings 36 within each of first row 38 and second row 40 are immediately adjacent one another.

Alternate configurations and results are of course contemplated, and will likely be dependent upon shape of the original openings and their arrangement(s) relative to one another, particularly if aligned in different rows. For example and by way of example only, circular openings formed in rows which are not offset from one another would likely experience shape transformation to squares, whereas circular openings wherein each adjacent row is offset relative to one another would likely form hexagonal openings upon treating with the plasma.

In embodiments where the treating with plasma reduces the degree of variability of one or more open dimensions, such might reduce such variability by a an amount or may reduce the degree of variability essentially to zero whereby the variability essentially disappears. In one embodiment, the degree of variability before the treating is greater than 10 percent in comparing the smallest of the open dimensions along the line to the largest of the open dimensions along the line before the act of exposure to/treatment with plasma. For example, variability of such largest and smallest open dimensions has been found to exceed 20% prior to treating with a plasma in accordance with some embodiments of the invention. The treating is ideally conducted to reduce degree of variability to be no greater than 10 percent in comparing the smallest of the open dimensions along the line to the largest of the open dimensions along the line after the treating. Ideally, such treating reduces such degree of variability after the treating to be no greater than 5 percent, and more ideally to no greater than 1 percent, in comparing the smallest of the open dimensions along the line to the largest of the open dimensions along the line after the treating.

In some embodiments, the treating with plasma is conducted to be self-limiting in reducing degree of variability of the open dimensions in the direction along the line. For example, each of the embodiments of FIG. 5 and of FIGS. 6 and 7 show reduction in variability along the direction of line 43 between adjacent openings to be zero or near zero. In other words, continued exposure to plasma in FIG. 5 is self-limiting in that no further improvement in variability is obtained by continued exposure to the plasma, although change in size of the individual openings might continue to occur. For example, the embodiment of FIGS. 6 and 7 depicts variability of the open dimension in the direction along the line of the individual openings to still be zero or near zero upon subsequent exposure to plasma, although both the opening size has increased in the direction along line 43 while the spacing between individual openings has decreased. In other words, FIGS. 6 and 7 depict the openings getting both larger and closer together as dimension A increases.

In one embodiment, the treating with plasma is conducted to be self-limiting to the increase of the open dimensions A along line 43 of the individual openings. In one embodiment, the treating is conducted to be self-limiting to the increase of the open dimensions B orthogonal to line 43 of the individual openings. FIG. 6 depicts an example embodiment wherein the treating with plasma has been conducted to be self-limiting to both the increase of the A and B open dimensions.

Regardless of achieving self-limiting aspects to one or both of variability reduction or size increase, the exposure to/treatment with plasma may be stopped at any point. For example, the exposure to plasma may be stopped before achieving the FIG. 5 embodiment, upon achieving the FIG. 5 embodiment, or after achieving the FIG. 5 embodiment. For example, the processing described below may be stopped at a point other than upon achieving the openings configuration of FIGS. 6 and 7.

By way of example only, any suitable plasma may be utilized for such treating. In one embodiment, the plasma is ideally chemically inert to the at least one of photoresist and amorphous carbon being treated, with the treating thereby essentially being entirely physical removal. In one embodiment, the plasma is exposed through the openings to material that is immediately underlying the photoresist and/or amorphous carbon, with the plasma ideally being chemically inert to such immediately underlying material. For example any one or combination of Ar, He, Ne, Kr, and Xe may be used as a plasma-generating gas and which is essentially chemically inert to material to which such is exposed. Using only a chemically inert plasma may provide an advantage of tailoring lateral dimension(s) of the openings prior to etching or otherwise processing the immediately underlying material. Alternately, the treating plasma may comprise a chemically reactive species with respect to material 34 and/or material immediately underlying material 34. For example, any of HBr, $SiCl_4$, $C_xF_y$, or $C_xH_yF_z$ may be use in addition to chemically inert components, where for example the physical removal effects of the plasma to material 34 is greater than any chemical removal effect to either of material 34 or material immediately underlying material 34.

Regardless, any example suitable plasma generating system, including remote plasma, is contemplated, with an inductively coupled plasma reactor being but one example system. In an inductively coupled plasma reactor, an example top power range is from 50 watts to 200 watts, and an example bottom power to the electrostatic chuck range is from 300 volts to 500 volts. An example pressure range within the chamber during plasma generation and exposure is from 2 mTorr to 100 mTorr. An example temperature range of the substrate during processing is from 10° C. to 70° C. An example range for the total flow of gas is from 50 sccm to 1,000 sccm for a sixty liter internal volume chamber, with from 200-500 sccm being a narrower example range. An example range of time for the treating is anywhere from 30 seconds to 2 minutes. Operating within the above example ranges may achieve one or more self-limiting aspects as identified above. Operating outside of one or more of the ranges is also contemplated.

The above example described and depicted processing conducted the etching of organic antireflective coating 32 prior to the treating with the plasma. Such may result in negligible if any lateral recessing of organic antireflective coating 32 within openings 36, thereby as shown leaving organic antireflective coating projecting feet portions 56 within openings 36 (FIG. 7). However, embodiments of the invention also contemplate that exposure of openings 36 to plasma which also laterally removes all of the organic antireflective coating (not shown) within openings 36 thereby preventing formation of the depicted feet 56. Further, embodiments of the invention also contemplate etching of the organic antireflective coating after the act of treating. Thereby, any of the organic antireflective coating 56 not physically removed by the exposure to plasma may be subsequently removed without any foot formation.

Figure 8:
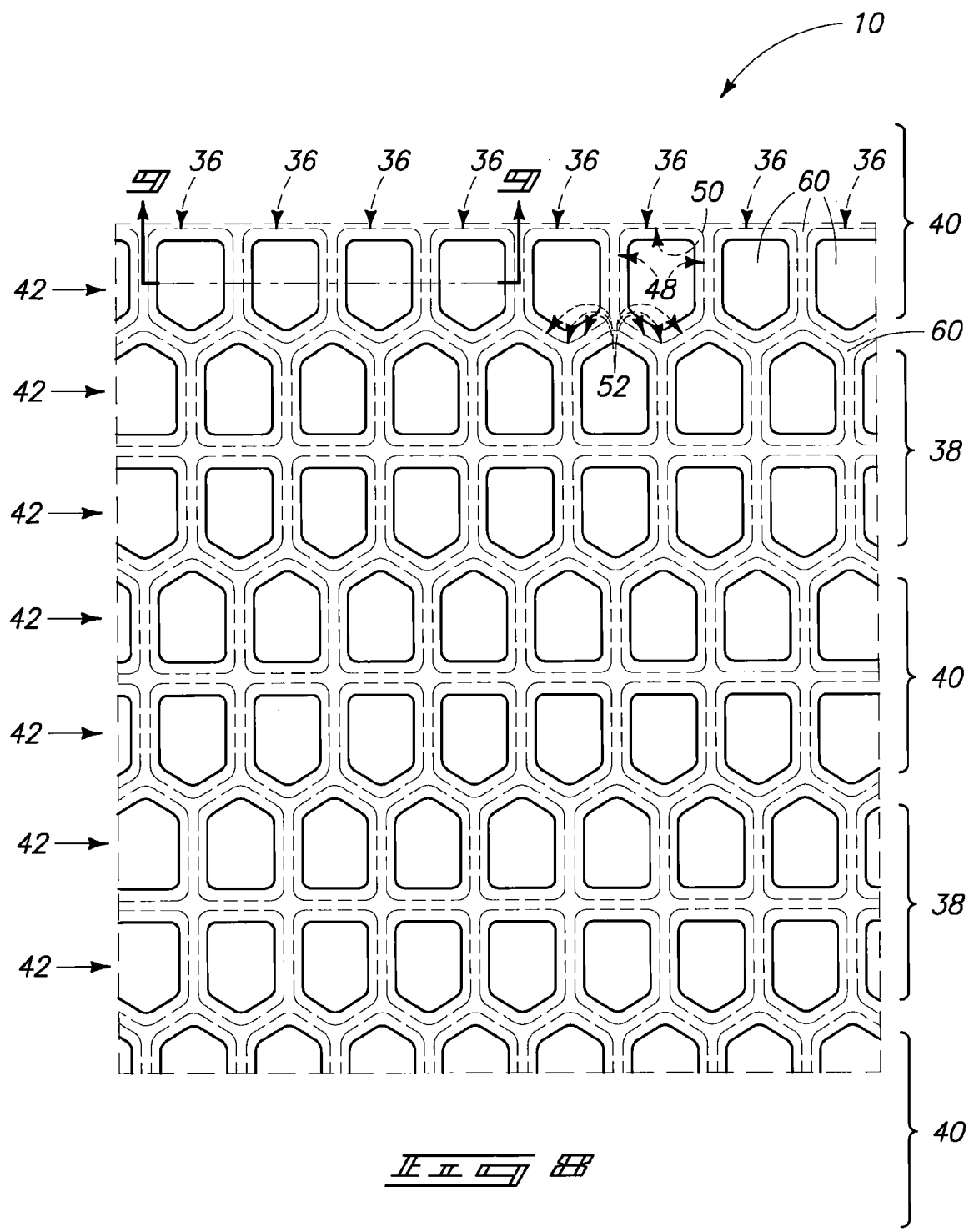
FIG. 8 is a view of the FIG. 6 substrate at a processing subsequent to that shown by FIG. 6.
Figure 9:
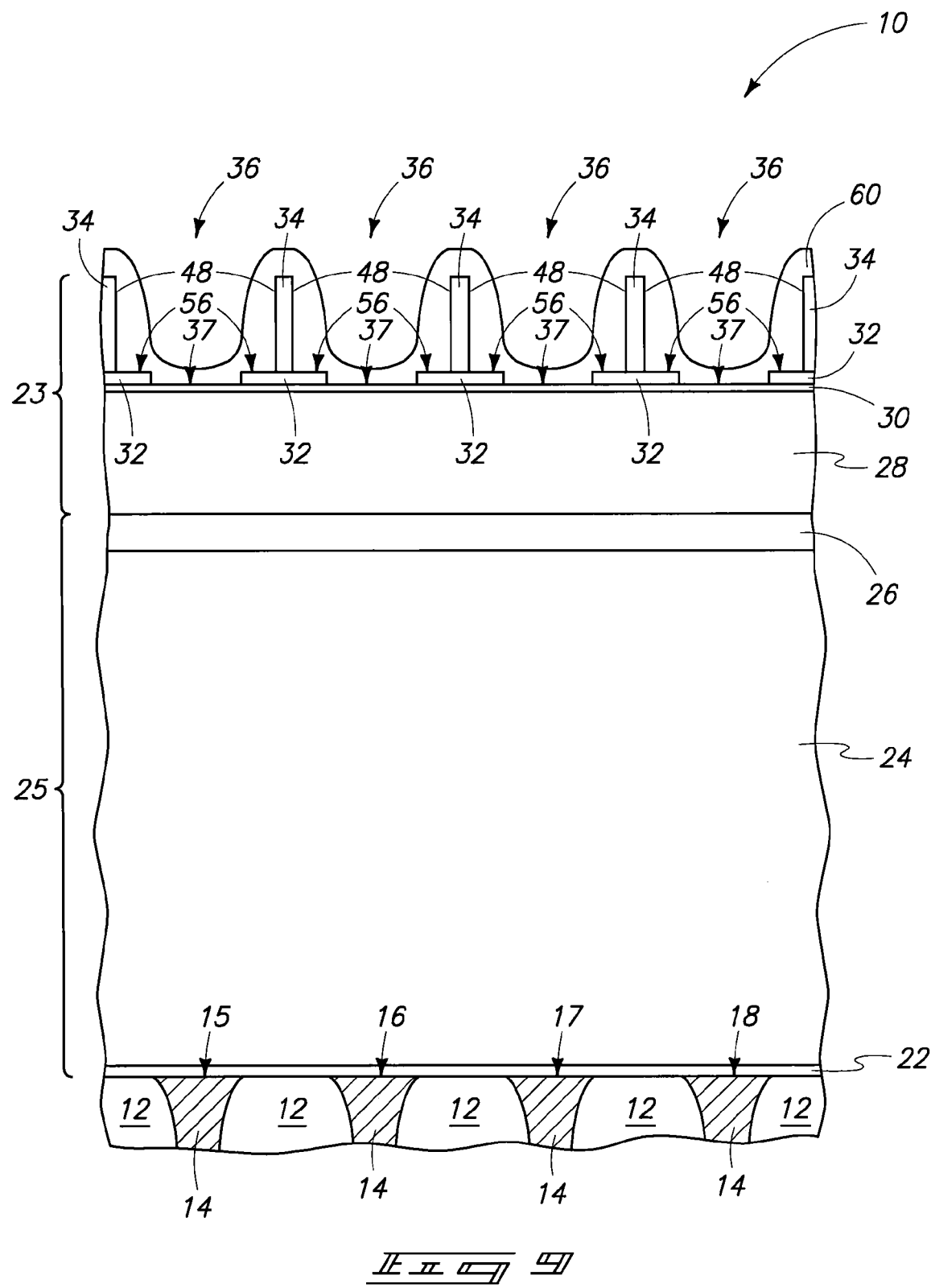
FIG. 9 is a sectional view taken through line 9-9 in FIG. 8.

Referring to FIGS. 8 and 9, masking material 60 has been formed over elevationally outermost surfaces of photoresist 34 and over sidewalls 48 of first extended openings 36 to reduce lateral open size of such openings. In one embodiment and as shown, masking material 60 has been deposited over photoresist 34, over sidewalls 48 of first extended openings 36, and over bases 37 of first extended openings 36 to reduce lateral open size of such openings. An example material 60 is undoped silicon dioxide deposited by chemical vapor deposition (for example using $SiCl_4$ and $O_2$ plasma), and atomic layer deposition technique. An alternate example material is a polymer, for example deposited by chemical vapor deposition using $CF_4$ and $CH_2F_2$ as precursors. By way of example, either could be deposited in situ within the chamber within which the plasma treating occurs.

Figure 10:
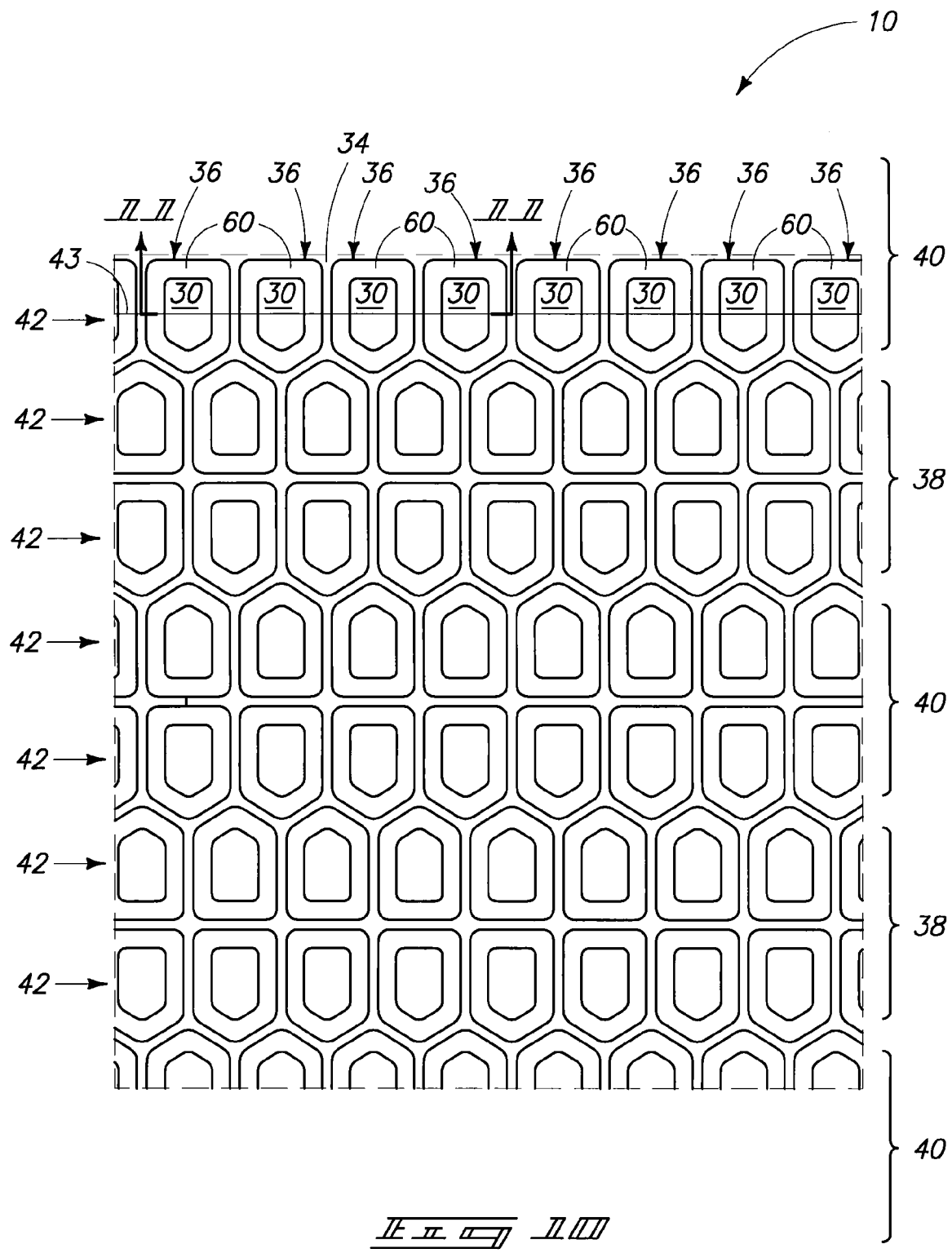
FIG. 10 is a view of the FIG. 8 substrate at a processing subsequent to that shown by FIG. 8.

Referring to FIGS. 10 and 11, masking material 60 has been etched through to inorganic antireflective coating 30 at bases 37 of first extended openings 36 while leaving masking material on sidewalls 48 of first extended openings 36. Accordingly, such provides but one example of forming masking material over sidewalls of the openings to reduce lateral open size of the openings. In one embodiment, such occurs by maskless (meaning no mask on the substrate) anisotropic etching of the masking material, for example to result in the FIGS. 10 and 11 construction. Further, such describes and provides but one embodiment of reducing lateral open sizes of the openings while maintaining a polygonal outermost cross sectional shape of the individual openings. Further in one embodiment and as shown, the etching through the masking material also removes all remaining of such masking material from being received over the elevationally outermost surfaces of photoresist 34.

Figure 12:
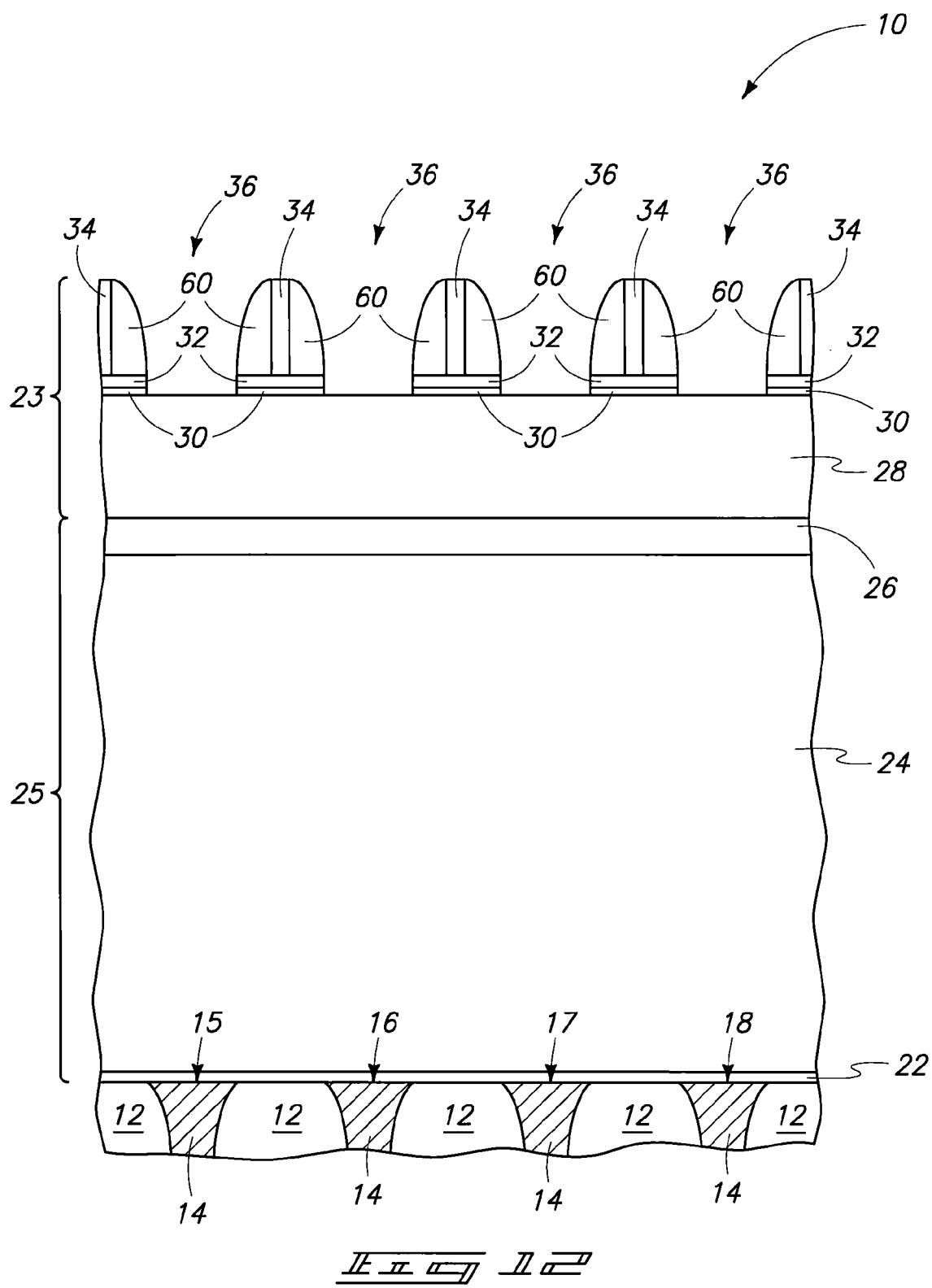
FIG. 12 is a view of the FIG. 11 substrate at a processing subsequent to that shown by FIG. 11.

Referring to FIG. 12, inorganic antireflective coating 30 has been etched to second extend the plurality of openings 36 through inorganic antireflective coating 30 to amorphous carbon hardmasking material 28 using at least photoresist 34 and masking material 60 as an etch mask. An example chemistry for anisotropically etching the inorganic antireflective coating, particularly where such comprises a combination of silicon, oxygen and nitrogen, comprises $CF_4$ and HBr.

Figure 14:
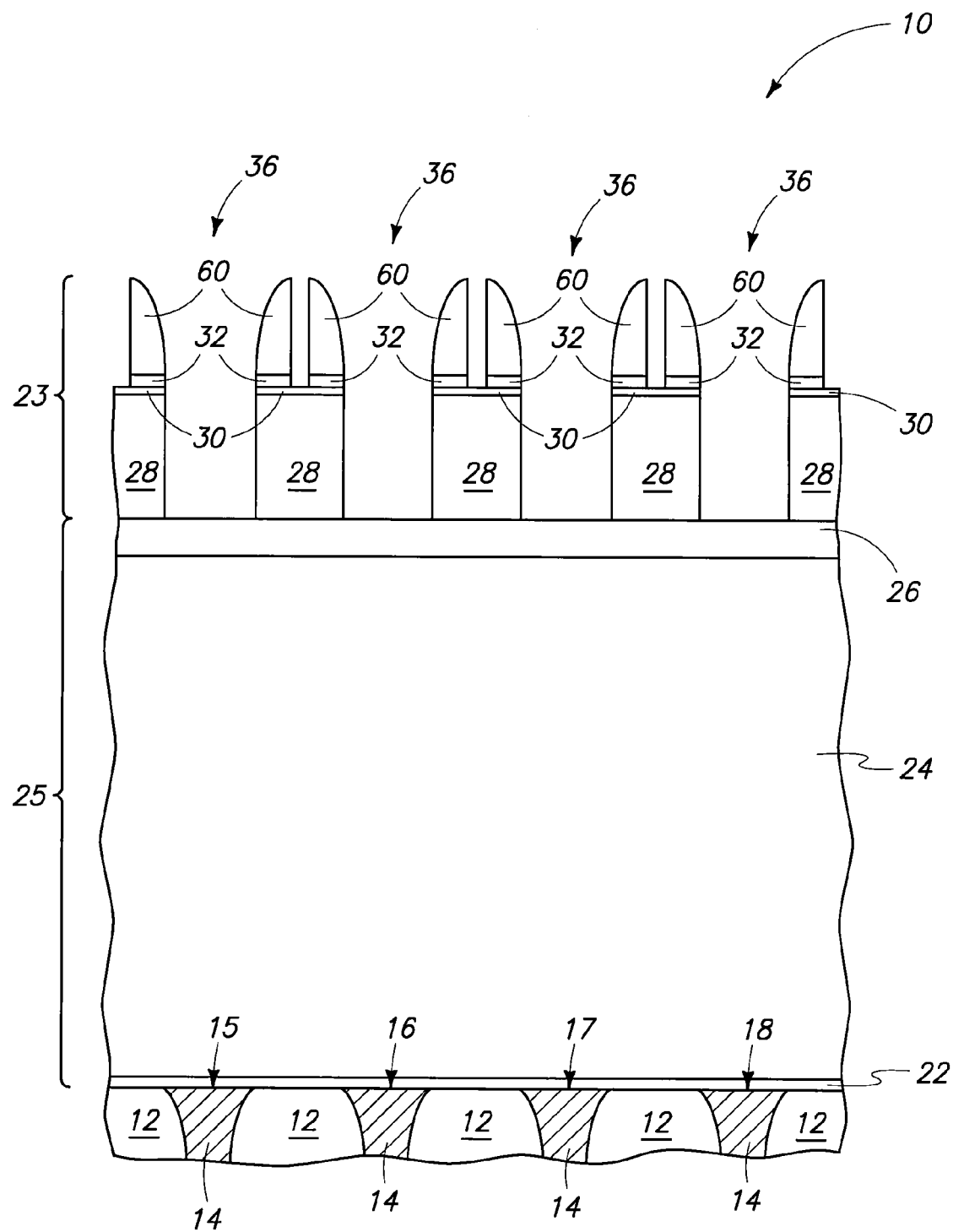
FIG. 14 is a view of the FIG. 12 substrate at an alternate processing to that shown by FIG. 13 and subsequent to that shown by FIG. 12.

Referring to FIG. 13, hardmask material 28 has been etched to third extend plurality of openings 36 through the hardmask material to material 25 to be etched using at least inorganic antireflective coating 30 and masking material 60 as another etch mask. FIG. 13 depicts one embodiment where etching of hardmasking material 28 has been conducted entirely selective to exposed materials 34 and 60. FIG. 14 depicts an alternate embodiment where, for example, hardmasking material 28 comprises amorphous carbon and using an etching chemistry comprising $SO_2$ and $O_2$. Such chemistry has also been effective to etch all remaining photoresist 34 (not shown) from the substrate, and as well etch organic antireflective coating material 32 which was received immediately therebeneath. Alternate chemistries and results are contemplated.

Remaining masking material 60 may be removed with dilute HF if composed of silicon dioxide at this point in the process, or removed subsequently, for example during etching of the material 25 where such comprises silicon dioxide. FIG. 15 depicts masking material 60 (not shown) having been removed from the embodiment of FIG. 14.

Figure 16:
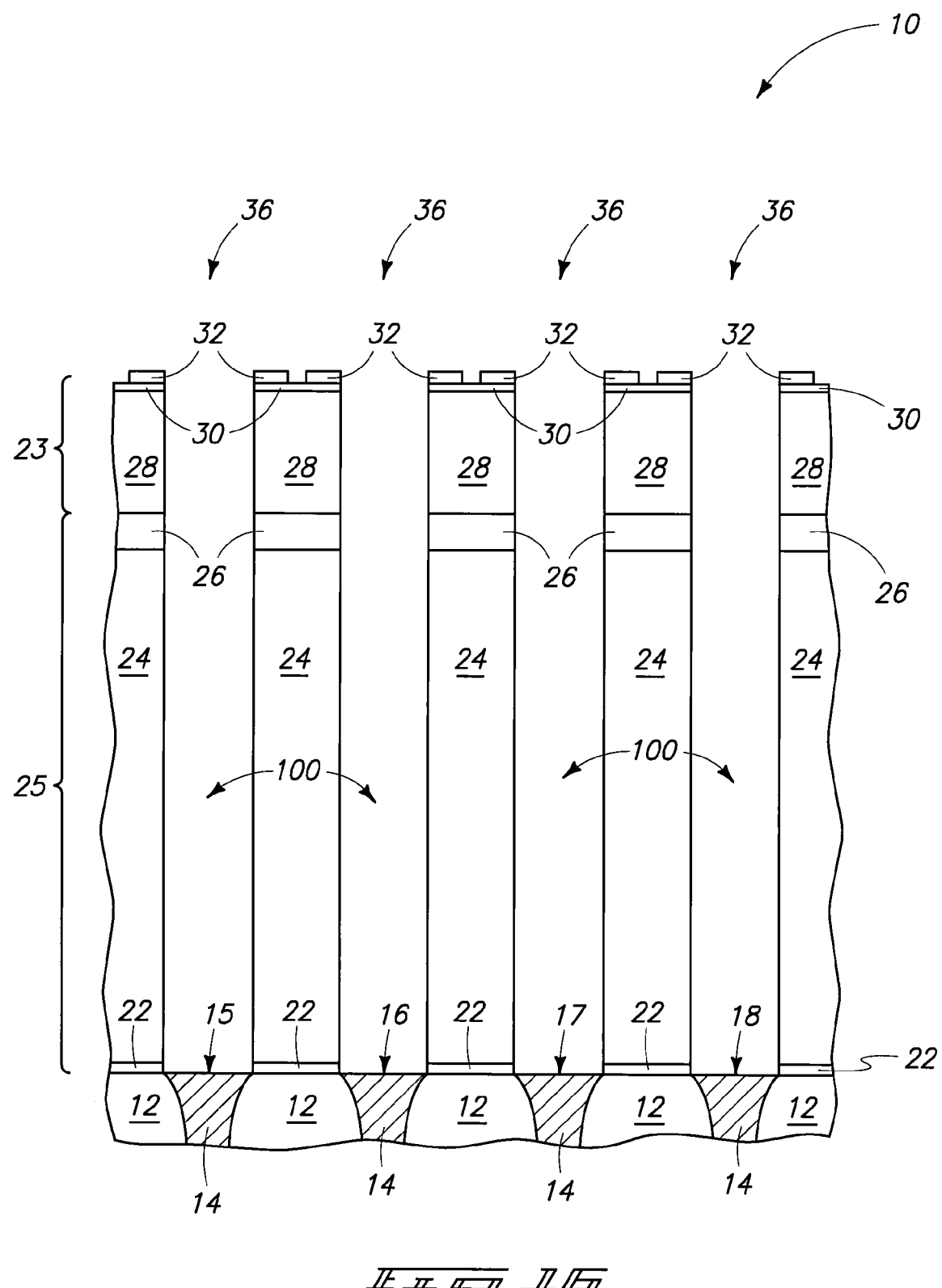
FIG. 16 is a view of the FIG. 15 substrate at a processing subsequent to that shown by FIG. 15.

Referring to FIG. 16, material 25 has been etched using at least hardmasking material 28 as a further etch mask to form a plurality of openings 100 within material 25. Hardmasking material 28 and any remaining material there-above would likely be subsequently removed. Processing may proceed subsequently to form capacitor electrodes within openings 100, followed by a formation of capacitor dielectric and one or more outer capacitor electrodes. Examples for fabricating such are shown, by way of example only in the following published documents. Other aspects associated in the formation of a plurality of capacitors, some of which include bracing structures, are also contemplated.

U.S. Published Application No. 2005/0051822;
U.S. Published Application No. 2005/0054159;
U.S. Published Application No. 2005/0158949;
U.S. Published Application No. 2005/0287780;
U.S. Published Application No. 2006/0014344;
U.S. Published Application No. 2006/0051918;
U.S. Published Application No. 2006/0046420;
U.S. Published Application No. 2006/0121672;
U.S. Published Application No. 2006/0211211;
U.S. Published Application No. 2006/0263968;
U.S. Published Application No. 2006/0261440;
U.S. Published Application No. 2007/0032014;
U.S. Published Application No. 2006/0063344;
U.S. Published Application No. 2006/0063345.

In one embodiment, a method of patterning a substrate comprises forming a plurality of openings within at least one of photoresist and amorphous carbon, and wherein the openings are of common outermost cross sectional shape relative one another. Individual of the openings have at least one lateral dimension having a degree of variability among the plurality. Such at least one of photoresist and amorphous carbon having the plurality of openings is treated with/exposed to a plasma effective to both increase the lateral open size of the openings and at least reduce the degree of variability of at least one lateral open dimension among the openings. The above example processing with respect to FIGS. 1-7 depict but example embodiments, and independent of subsequent processing conducted to etch or otherwise process material received beneath the photoresist and/or amorphous carbon, and independent of whether additional masking material is put on the sidewalls of the enlarged openings.

In one embodiment, a method of patterning a substrate comprises forming alternating first and second pairs of rows of openings within at least one of photoresist and amorphous carbon. Individual of the openings are of common outermost cross sectional shape relative to one another, and such shape comprises curved sides. The alternating first and second pairs of rows are characterized relative one another by having their respective openings offset relative to the openings in immediately adjacent of the other of the first pair or second pair of rows. FIG. 2 depicts, by way of example only, such an embodiment.

The photoresist and/or amorphous carbon having the alternating first and second pairs of rows of openings is exposed to a plasma effective to both increase lateral open size of the openings and change the common outermost cross sectional shape to a common polygonal outermost cross sectional shape. The processing from FIGS. 2-7 as shown and described above is but one example processing, and independent of what if any subsequent processing occurs relative to material received beneath the photoresist, and independent of whether additional masking material is put on the sidewalls of the enlarged openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of patterning a substrate having a plurality of openings within at least one of photoresist and amorphous carbon, comprising treating the openings within the at least one of photoresist and amorphous carbon with a plasma to both increase at least a lateral open size of those portions of the openings that are within the at least one of photoresist and amorphous carbon and at least reduce a degree of variability of at least one lateral open dimension among those portions of the openings that are within the at least one of photoresist and amorphous carbon.

2. The method of claim 1 wherein the openings are formed in photoresist.

3. The method of claim 1 wherein the openings are formed in amorphous carbon.

4. The method of claim 1 wherein the plasma is chemically inert to said treated at least one of photoresist and amorphous carbon.

5. The method of claim 1 wherein the plasma is exposed through the openings to material immediately underlying said at least one of photoresist and amorphous carbon which is other than photoresist and amorphous carbon, the plasma being chemically inert to said immediately underlying material.

6. A method of patterning a substrate, comprising:
forming a plurality of openings along a line within at least one of photoresist and amorphous carbon, the openings being of common outermost cross sectional shape relative one another, the openings having an open dimension in a direction along the line, the open dimensions among the openings having a degree of variability; and
treating the openings within the at least one of photoresist and amorphous carbon with a plasma to both increase the open dimensions among the openings within the at least one of photoresist and amorphous carbon along the line and at least reduce the degree of variability of the open dimensions among the openings within the at least one of photoresist and amorphous carbon along the line.

7. The method of claim 6 wherein,
the degree of variability before the treating is greater than 10% in comparing the smallest of the open dimensions along the line to the largest of the open dimensions along the line before the treating; and
the treating is conducted to reduce degree of variability to be no greater than 10% in comparing the smallest of the open dimensions along the line to the largest of the open dimensions along the line after the treating.

8. The method of claim 6 wherein the treating is conducted to reduce degree of variability to be no greater than 5% in comparing the smallest of the open dimensions along the line to the largest of the open dimensions along the line after the treating.

9. The method of claim 8 wherein the degree of variability before the treating is greater than 10% in comparing the smallest of the open dimensions along the line to the largest of the open dimensions along the line before the treating.

10. The method of claim 6 wherein the treating is conducted to reduce degree of variability to be no greater than 1% in comparing the smallest of the open dimensions along the line to the largest of the open dimensions along the line after the treating.

11. The method of claim 10 wherein the degree of variability before the treating is greater than 10% in comparing the smallest of the open dimensions along the line to the largest of the open dimensions along the line before the treating.

12. The method of claim 6 wherein the treating changes the common outermost cross sectional shape.

13. The method of claim 12 wherein the common outermost cross sectional shape before the treating is void of straight sides, and the common outermost cross sectional shape after the treating comprises a straight side.

14. The method of claim 6 wherein the treating is conducted to be self-limiting to the reduction of the degree of variability of said open dimensions along the line.

15. The method of claim 6 wherein,
the individual openings have an open dimension orthogonal to the direction along the line; and
the treating increasing the open dimension orthogonal to the direction along the line of the individual openings.

16. The method of claim 15 wherein the treating is conducted to be self-limiting to the increase of said open dimensions orthogonal to the direction along the line of the individual openings.

17. The method of claim 16 wherein the treating is conducted to be self-limiting to the increase of said open dimensions in the direction along the line of the individual openings.

18. A method of patterning a substrate, comprising:
forming a mask comprising photoresist which is received over an antireflective coating which is received over a material to be etched;
forming a plurality of openings within the photoresist to the antireflective coating, the openings being of common outermost cross sectional shape relative one another;

treating the photoresist having the plurality of openings with a plasma to increase lateral open size of those portions of the openings that are within the photoresist;

after the treating, forming masking material over sidewalls of the openings in the photoresist to reduce lateral open size of the openings; and after forming the masking material, etching said material to be etched to form a plurality of openings within said material to be etched.

19. The method of claim 18 wherein the forming of the masking material comprises depositing the masking material over elevationally outermost surfaces of the photoresist and bases of the openings, followed by maskless anisotropic etching of the masking material to leave said masking material over the sidewalls of the openings.

20. The method of claim 18 wherein the mask comprises a hardmask material intermediate the material to be etched and the antireflective coating.

21. A method of patterning a substrate, comprising:

forming a mask over a material to be etched, the mask comprising photoresist received over an organic antireflective coating which is received over an inorganic antireflective coating which is received over amorphous carbon;

forming a plurality of openings through the photoresist to the organic antireflective coating, the openings being of common outermost cross sectional shape relative one another;

treating the photoresist having the plurality of openings with a plasma to increase lateral open size of the openings;

etching the organic antireflective coating to first extend the plurality of openings through the organic antireflective coating to the inorganic antireflective coating;

depositing masking material over the photoresist, over sidewalls of the first extended openings, and over bases of the first extended openings to reduce lateral open size of the openings;

etching through the masking material to the inorganic antireflective coating at the bases of the first extended openings while leaving masking material on the sidewalls of the first extended openings;

etching the inorganic antireflective coating to second extend the plurality of openings through the inorganic antireflective coating to the amorphous carbon using at least the photoresist and the masking material as an etch mask;

etching the amorphous carbon to third extend the plurality of openings through the amorphous carbon to said material to be etched using at least the inorganic antireflective coating and the masking material as another etch mask; and etching said material to be etched using at least the amorphous carbon as a further etch mask to form a plurality of openings within said material to be etched.

22. The method of claim 21 wherein said etching of the organic antireflective coating occurs before said treating.

23. The method of claim 21 wherein said etching of the organic antireflective coating occurs after said treating.

24. The method of claim 21 wherein said etching of the amorphous carbon also removes all remaining photoresist from the substrate.

25. The method of claim 21 wherein said etching through the masking material also removes all remaining of the masking material received over elevationally outermost surfaces of the photoresist.

26. A method of patterning a substrate, comprising:

forming alternating first and second pairs of rows of openings within at least one of photoresist and amorphous carbon, individual of the openings being of common outermost cross sectional shape relative one another, said shape comprising curved sides, the alternating first and second pairs of rows being characterized relative one another by having their respective openings offset relative to the openings in immediately adjacent of the other of the first pair or second pair of rows; and treating the at least one of photoresist and amorphous carbon having alternating first and second pairs of rows of openings to a plasma to both increase lateral open size of the openings and change the common outermost cross sectional shape to a common polygonal outermost cross sectional shape.

27. The method of claim 26 wherein the common shape before the treating consists essentially of curved sides.

28. The method of claim 26 comprising after the treating, reducing lateral open size of the openings while maintaining the polygonal outermost cross sectional shape of the individual openings.

29. The method of claim 26 wherein the common outermost cross sectional shape comprising curved sides is oval and the polygonal outermost cross sectional shape is pentagonal, the common pentagonal shape comprising opposing parallel sidewalls, a base extending between the opposing parallel sidewalls, and a two sided pointed end opposite the base; the bases of each of the openings within each of the first and second pairs of rows being immediately adjacent one another.

30. A method of patterning a substrate, comprising:

forming rows of openings within at least one of photoresist and amorphous carbon, the openings having circular outermost cross sectional shape, the rows not having their respective openings offset relative to the openings in immediately adjacent rows; and treating the at least one of photoresist and amorphous carbon to a plasma to both increase lateral open size of the openings that are within the at least one of photoresist and amorphous carbon and change the circular outermost cross sectional shape to be squares.

31. The method of claim 30 wherein the openings are formed in photoresist.

32. The method of claim 30 wherein the openings are formed in amorphous carbon.

33. The method of claim 30 wherein the plasma is chemically inert to said treated at least one of photoresist and amorphous carbon.

34. The method of claim 30 wherein the plasma is exposed through the openings to material immediately underlying said at least one of photoresist and amorphous carbon which is other than photoresist and amorphous carbon, the plasma being chemically inert to said immediately underlying material.

35. A method of patterning a substrate, comprising:

forming rows of openings within at least one of photoresist and amorphous carbon, the openings having circular outermost cross sectional shape, the rows having their respective openings offset relative to the openings in immediately adjacent rows; and treating the at least one of photoresist and amorphous carbon to a plasma to both increase lateral open size of the openings that are within the at least one of photoresist and amorphous carbon and change the circular outermost cross sectional shape to be hexagons.

36. The method of claim 35 wherein the openings are formed in photoresist.

37. The method of claim 35 wherein the openings are formed in amorphous carbon.

38. The method of claim 35 wherein the plasma is chemically inert to said treated at least one of photoresist and amorphous carbon.

39. The method of claim 35 wherein the plasma is exposed through the openings to material immediately underlying said at least one of photoresist and amorphous carbon which is other than photoresist and amorphous carbon, the plasma being chemically inert to said immediately underlying material.

* * * * *